United States Patent [19]
Inokuchi

[11] Patent Number: 6,087,888
[45] Date of Patent: Jul. 11, 2000

[54] FIELD EFFECT TRANSISTOR GATE BIAS VOLTAGE APPLICATION CIRCUIT AND SEMICONDUCTOR APPARATUS HAVING FIELD EFFECT TRANSISTOR GATE BIAS VOLTAGE APPLICATION CIRCUIT

[75] Inventor: Kazuyuki Inokuchi, Tokyo, Japan

[73] Assignee: Oki Electric Industry Co., Ltd., Tokyo, Japan

[21] Appl. No.: 09/195,659

[22] Filed: Nov. 18, 1998

[30] Foreign Application Priority Data

Nov. 18, 1997 [JP] Japan ................................. 9-317527

[51] Int. Cl.$^7$ .......................... H01L 35/00; H03K 17/687
[52] U.S. Cl. ............................. 327/513; 327/427
[58] Field of Search ..................... 327/512, 513, 327/427, 434, 435, 530, 538, 543, 362, 80, 81, 430, 431

[56] References Cited

U.S. PATENT DOCUMENTS

| | | | |
|---|---|---|---|
| 4,749,877 | 6/1988 | Asazawa et al. | 327/434 |
| 5,187,395 | 2/1993 | Pirez | 327/513 |
| 5,532,578 | 7/1996 | Lee | 327/538 |
| 5,869,997 | 2/1999 | Tomishima | 327/543 |

FOREIGN PATENT DOCUMENTS 5-175747 7/1993 Japan .

Primary Examiner—Toan Tran
Attorney, Agent, or Firm—Venable; Robert J. Frank

[57] ABSTRACT

FET gate bias voltage application circuits and semiconductor apparatuses in which such a FET gate bias voltage application circuit is installed compensate for adverse effects caused by changes in the surrounding temperature. A temperature compensation FET is installed in a FET gate bias voltage application circuit in which a divided voltage is applied to the gate of a controlled FET from a first intermediate point of a resistance type potential dividing circuit to which a direct current voltage is applied. This temperature compensation FET becomes conductive at a gate voltage higher than the gate voltage of the controlled FET. A voltage divided at the first intermediate point is applied to the gate of this temperature compensation FET. The drain of this temperature compensation FET is connected to a second intermediate point at which the electric potential is higher than the electric potential at the first intermediate point. The source of this temperature compensation FET is grounded. This temperature compensation FET remains nonconductive when the gate-drain current of the controlled FET is at a low level. This temperature compensation FET becomes conductive when the gate-drain current of the controlled FET increases to a high level to cause a drain-source current to flow through this temperature compensation FET. As a result, the amount of voltage drop increases at a region in which the electric potential is higher than the electric potential at the second intermediate point of the resistance type potential dividing circuit. This causes the electric potentials at the first and second intermediate points, respectively, to be shifted in the negative direction.

6 Claims, 5 Drawing Sheets

FIELD EFFECT TRANSISTOR GATE BIAS VOLTAGE APPLICATION CIRCUIT AND SEMICONDUCTOR APPARATUS HAVING FIELD EFFECT TRANSISTOR GATE BIAS VOLTAGE APPLICATION CIRCUIT

BACKGROUND OF THE INVENTIOIN

1. Field of the Invention

The present invention related to a field effect transistor (FET) gate bias voltage application circuit and a semiconductor apparatus in which this FET gate bias voltage application circuit is installed.

2. Description of Related Art

An example of a conventional FET gate bias voltage application circuit will be explained with reference to FIG. 1.

$Q_1$ is a FET to be controlled. In this example, it is assumed that this is an n-channel depression type FET whose threshold voltage $V_{th}$ is −1.5V. G, D, and S refer to a gate, a drain, and a source, respectively. A voltage $V_{dd}$ (+3V) is applied to the drain D. The source S is grounded. A voltage applied to a serial circuit made of resistors $R_1$ (1333Ω) and $R_2$ (667Ω) is divided at the connection node of these resistors. The voltage at this connection node is used as a gate bias voltage. To be more precise, +3V is applied to one end $V_{g1}$ of this serial circuit and −3V is applied to the other end $V_{g2}$ of this serial circuit. The voltage (−1V) at the connection point of the two resistors is applied as a ate bias voltage $V_g$ to the gate G of the controlled FET $Q_1$. he threshold voltage of this controlled FET $Q_1$ is set to −1.5V. When the gate bias voltage $V_g$ is applied to this controlled FET $Q_1$ this controlled FET $Q_1$ becomes conductive. The reference electric potential of a high frequency input signal superposed on this gate bias voltage $V_g$ and input to this controlled FET $Q_1$ is determined by this gate bias voltage $V_9$.

The drain-source current of a FET is expressed by the following equation $$I_{ds} \approx K(V_{gs}-V_{th})^2,$$

where
$I_{ds}$ represent the drain-source current of the FET,
K represents the K-value of the FET,
$V_{gs}$ represents the gate-source voltage of the FET, and
$V_{th}$ represents the threshold voltage of the FET.

Since both the K-value and the threshold voltage have negative temperature coefficients, the K-value and the threshold voltage are canceled when the surrounding temperature changes. Therefore, the source-drain current is not affected significantly by the change in the surrounding temperature.

However, it is known that the gate-drain current $I_{gd}$ of a Schottky FET (all the FETs to be described in what follows are Schottky FETs) is expressed by $$I_{gd}=I_{gd\Delta}(\exp(qV/kT)-1),$$

where
$I_{gd\Delta}SA^*T^2\exp(-q\Phi_S/kT)$,
S is the area of the gate,
$A^*$ is the effective Richardson constant,
q is the unit electric charge,
$\Phi_S$ is the height of the Schottky barrier,
k is the Boltzmann constant, and
T is the absolute temperature.

When the FET is used at a high temperature, for example, above 50° C., the gate-drain current $I_{gd}$, which should remain zero, increases to a level that cannot be ignored. As a result, the gate-bias voltage of the FET changes. In the example shown in FIG. 1, the amount of voltage drop within the resistor $R_2$ increases when the gate-drain current $I_{gd}$ increases. This causes the voltage $V_g$ at the potential dividing node to be shifted in the positive direction.

FIG. 2 shows the manner in which the gate voltage $V_g$ of the FET gate voltage application circuit shown in FIG. 1 is shifted in the positive direction when the surrounding temperature rises above 50° C.

This positive shift of the gate voltage $V_g$ increases the drain-source current $I_{ds}$ of the controlled n-channel depression type FET, which is a problematic characteristic.

This characteristic causes a serious problem when the FET is used for apparatuses exposed to a wide range of surrounding temperature fluctuation such as a cellular phone.

In addition, since the carrier mobility of GaAs is large, it operates fast, which is an advantage. In particular, it is known that GaAs is useful as a semiconductor material for a high frequency wave (microwave) circuit amplifier. The above-described characteristic also poses a significant problem when a GaAs FET is installed in a high frequency wave (microwave) circuit amplifier.

Given this problem, it is an object of the present invention to provide a FET gate bias voltage application circuit, to which a voltage obtained by dividing a direct current resistance is applied as a gate bias voltage to the gate of a controlled FET, capable of compensating for changes in the gate bias voltage caused by temperature changes to suppress the change in the drain-source current of the controlled FET and a semiconductor apparatus in which this FET gate bias voltage application circuit is installed.

SUMMARY OF THE INVENTION

In order to achieve the above-stated first object, a FET gate bias voltage application circuit according to the first embodiment of the present invention has a resistor serial circuit (resistance type potential dividing circuit) having three serially connected resistors and a temperature compensation FET. The voltage at the connection node of the second and third resistors is applied to the gate of the controlled FET. The drain of the temperature compensation FET is connected to the connection node of the first and second resistors of the resistor serial circuit (resistance type potential dividing circuit). The source of the temperature compensation FET is grounded. The gate of the temperature compensation FET is connected to the connection node of the second and third resistors of the resistor serial circuit. This temperature compensation FET becomes conductive at a gate voltage higher than the gate voltage of the controlled FET (The threshold voltage of this temperature compensation FET is higher than that of the controlled FET.). This temperature compensation FET remains non-conductive when the surrounding temperature is low in which case the gate-drain current of the controlled FET is at a low level. However, when the surrounding temperature rises to a high level, the gate-drain current of the controlled FET increases. As a result, the gate bias voltage (the electric potential at the connection node of the second and third resistors) is shifted in the positive direction. This causes the temperature compensation FET to become conductive. As a result, a drain-source current flows through the temperature compensation FET, and the amount of voltage drop inside the first resistor increases. This causes the electric potential at the connection node of the first and second resistors to be shifted in the negative direction. The shift in the negative direction of the electric potential at the connection node of the first and second resistors, which is caused by the increase in the amount of voltage drop generated in the first resistor by the drain-source current of the temperature compensation FET, compensates for the shift in the positive direction of the electric potential at the connection node of the first and second resistors generated by the increase in the gate-drain current of the controlled FET. As a result, the gate voltage of the controlled FET is held constant regardless of the change in the gate-drain current of the controlled FET.

In order to achieve the above-stated first object, a FET gate bias voltage application circuit according to the second embodiment of the present invention has a resistor serial circuit (resistance type potential dividing circuit) having four serially connected resistors and a temperature compensation FET. The voltage at the connection node of the second and third resistors of the resistor serial circuit (resistance type potential dividing circuit) is applied to the gate of the controlled FET. The drain of the temperature compensation FET is connected to the connection node of the first and second resistors of the resistor serial circuit (resistance type potential dividing circuit). The source of the temperature compensation FET is grounded. The voltage at the connection node of the third and fourth resistors of the resistor serial circuit (resistance type potential dividing circuit) is applied to the gate of the temperature compensation FET. This temperature compensation FET becomes conductive at the same gate voltage as the controlled FET (The threshold voltage of this temperature compensation FET is the same as that of the controlled FET.). This temperature compensation FET remains non-conductive when the surrounding temperature is low in which case the gate-drain current of the controlled FET is at a low level. However, when the surrounding temperature rises to a high level, the gate-drain current of the controlled FET increases. As a result, the gate bias voltage (the electric potential at the connection node of the second and third resistors) is shifted in the positive direction. This causes the temperature compensation FET to become conductive. As a result, a drain-source current flows through the temperature compensation FET, and the amount of voltage drop inside the first resistor increases. This causes the electric potential at the connection node of the first and second resistors, the connection node of the second and third resistors, and the connection node of the third and fourth resistors to be shifted in the negative direction. The shift in the negative direction of the electric potential at the connection node of the second and third resistors generated in the first resistor by the drain-source current of the temperature compensation FET compensates for the shift in the positive direction of the electric potential at the connection node of the second and third resistors generated by the increase in the gate-drain current of the controlled FET. As a result, the gate voltage of the controlled FET is held constant regardless of the change in the gate-drain current of the controlled FET.

If the controlled FET and the temperature compensation FET of the FET gate bias voltage application circuit of according to the first and second embodiments of the present invention are of the same type, for example, if both FETs are MESFETs, the characteristics of the two FETs change in the same manner when the surrounding temperature changes. As a result, the influence of the change in the characteristics caused by the change in the surrounding temperature becomes virtually negligible.

In order to achieve the above-stated second object, semiconductor apparatuses according to the third and fourth embodiments of the present invention have a print substrate having a large heat conductivity in which at least a portion of a resistance type potential dividing circuit as described above is installed or formed, a controlled FET as described above bonded onto the print substrate, and a temperature compensation FET as described above bonded onto the print substrate.

In order to achieve the above-stated second object, semiconductor apparatuses according to the fifth and sixth embodiments of the present invention are constructed by bonding the above-described temperature compensation FET onto a print substrate in which the controlled FET and at least a portion of the resistance type potential dividing circuit as described above are installed or formed.

In order to achieve the above-stated second object, semiconductor apparatuses according to the seventh and eighth embodiments of the present invention are constructed by forming inside a single semiconductor chip the above-described temperature compensation FET, controlled FET, and at least a portion of the resistance type potential dividing circuit.

In order to achieve the above-stated second object, semiconductor apparatuses according to the ninth and tenth embodiments of the present invention are constructed by forming inside a single semiconductor chip the above-described FET gate bias voltage application circuit.

The main technical idea of the present invention is to hold constant the gate voltage of the controlled FET $Q_1$ (the electric potential at the connection node the second resistor $R_2$ and third resistor $R_3$) voltage. This is accomplished as follows. A gate-drain current $I_{gd}$ is inevitably generated at a high temperature. This gate-drain current $I_{gd}$ causes a voltage drop in the third resistor $R_3$ (in the case of claim 1) or in the fourth resistor $R_4$ (in the case of claim 2). The amount of this voltage drop causes the electric potential at the connection node of the second resistor $R_2$ and third resistor $R_3$ to be shifted in the positive direction (including the cases of claims 1 and 2). The drain-source current of the temperature compensation FET $Q_2$ according to the present invention increases the amount of voltage drop generated in the first resistor $R_1$. This increased amount of voltage drop generated in the first resistor $R_1$ causes the electric potential at the connection node of the second resistor $R_2$ and third resistor $R_3$ to be shifted in the negative direction (including the cases of claims 1 and 2). The main idea of the present invention is to cancel the amount of positive shift of the electric potential at the connection node of the second resistor $R_2$ and third resistor $R_3$ by this negative shift of the electric potential at the connection node of the second resistor $R_2$ and third resistor $R_3$.

DETAILED DESCRIPTION OF THE INVENTION

Figure 1:
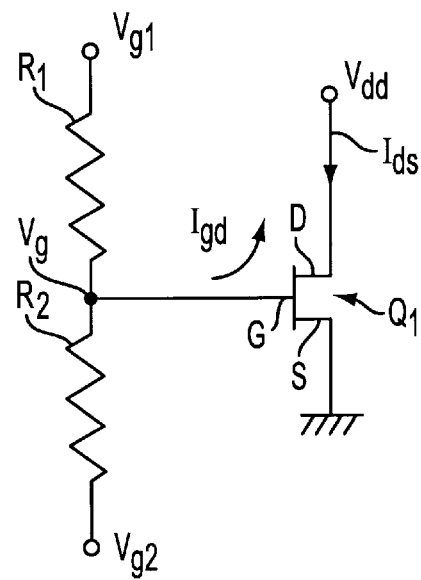
FIG. 1 is a connection diagram of a FET gate bias voltage application circuit according to the prior art.
Figure 2:
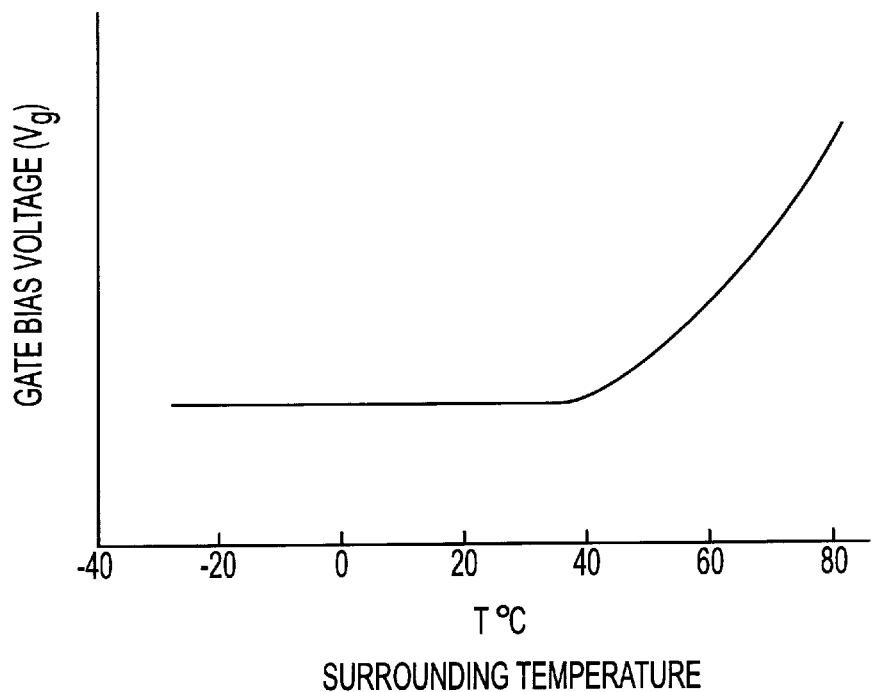
FIG. 2 is a graph showing the relation between the gate bias voltage and the surrounding temperature.

In what follows, two FET gate bias voltage application circuits according to two embodiments of the present invention and six semiconductor apparatuses in which these two FET gate bias voltage application circuits are installed will be explained in detail to clarify their configurations and characteristic effects.

First Embodiment

The first embodiment of the present invention will be explained with reference to FIG. 3. According to the first embodiment of the present invention, a FET gate bias voltage application circuit having three serially connected resistors and a temperature compensation FET is provided. The voltage at the connection node of the second and third resistors is the gate bias voltage of the controlled FET. This voltage is applied to the gate of the temperature compensation FET. The drain of the temperature compensation FET is connected to the connection node of the first and second resistors of the resistor serial circuit (resistance type potential dividing circuit). The source of the temperature compensation FET is grounded.

$Q_1$ is an n-channel depression type controlled FET whose threshold voltage is $-1.5V$. A voltage $V_{dd}$ ($+3V$) is applied to the drain $D_1$ of $Q_1$. The source $S_1$ of $Q_1$ is grounded. A gate bias voltage ($-1V$) is applied to the gate $G_1$ of $Q_1$. The controlled FET $Q_1$ is conductive in this state and a drain-source current $I_{ds1}$ is flowing through $Q_1$.

A first resistor $R_1$ (667Ω), a second resistor $R_2$ (667Ω) and a third resistor $R_3$ (667Ω) are connected serially in this order. A voltage $V_{g1}$ ($+3V$) is applied to the end of the first resistor $R_1$ not connected to the second resistor $R_2$, and a voltage $V_{g2}$ ($-3V$) is applied to the end of the third resistor $R_3$ not connected to the second resist or $R_2$. The voltage at the connection node of the second resistor $R_2$ and third resistor $R_3$ is $-1V$. This voltage at the connection node of the second resistor $R_2$ and third resistor $R_3$ is applied to the gate $G_1$ of the controlled FET $Q_1$. As a result, the above-described drain-source current $I_{ds1}$ flows through $Q_1$. A high frequency input signal is superposed on this gate bias voltage $V_g$ and is input to the gate $G_1$ to be amplified.

Since the aim of the controlled FET $Q_1$ is to amplify the high frequency input signal, the gate width of $Q_1$ is determined in accordance with the high frequency output of $Q_1$. If the high frequency output of $Q_1$ is 1 W (30 dB$_m$), for example, the saturated drain-source current becomes about 2 A, and the corresponding gate width becomes about 10 mm.

$Q_2$ is a temperature compensation FET according to the present invention. $Q_2$ is an n-channel depression type FET whose threshold voltage is $-1V$. The voltage ($-1V$) at the connection node of the second resistor $R_2$ and third resistor $R_3$ is applied to the gate $G_2$ of $Q_2$. $Q_2$ is non-conductive in this state. The voltage ($+1V$) at the connection node of the first resistor $R_1$ and second resistor $R_2$ is applied to the drain $D_2$ of $Q_2$. The source $S_2$ of $Q_2$ is grounded.

When the surrounding temperature is low, the temperature compensation FET $Q_2$ is non-conductive. The gate-drain current $I_{gd1}$ of the controlled FET $Q_1$ is zero when the surrounding temperature is low. However, when the surrounding temperature rises above 50° C., the maximum of the gate-drain current $I_{gd1}$ of the controlled FET $Q_1$ reaches about 1 mA. This current $I_{gd1}$ is superposed on the current (1.5mA) determined by the first resistor $R_1$, second resistor $R_2$, third resistor $R_3$ and the direct current voltage ($V_{g1}-V_{g2}=3V-(-3V)=6V$) applied to the first resistor $R_1$, second resistor $R_2$, and third resistor $R_3$. The resultant current flows through the third resistor $R_3$.

Therefore, without the temperature compensation FET $Q_2$, the electric potential at the first connection node (the connection node of the first resistor $R_1$ and second resistor $R_2$) is shifted in the positive direction by 0.667V, and the reference point of the drain-source current $I_{ds1}$ is displaced significantly.

However, according to the present embodiment, when the electric potential at the first connection node is shifted slightly in the positive direction and becomes higher than the threshold voltage ($-1V$) of the temperature compensation FET $Q_2$, the temperature compensation FET $Q_2$ becomes conductive, and a drain-source current $I_{ds2}$ flows through the temperature compensation FET $Q_2$. This drain-source current $I_{ds2}$ flows through the first resistor $R_1$. Therefore, the amount of voltage drop generated in the first resistor $R_1$ increases. As a result, the electric potential at the second connection node (the connection node of the second resistor $R_2$ and third resistor $R_3$) is shifted in the negative direction. In this case, the resistance of the temperature compensation FET $Q_2$ does not become zero. Hence, a current continues to flow through the second resistor $R_2$ and third resistor $R_3$. Since the second resistor $R_2$ and third resistor $R_3$ have the same resistance value, the electric potential at the first connection node is shifted in the negative direction by half the negative shift amount of the electric potential at the second connection node. In this case, if the current that flows through the temperature compensation FET $Q_2$ is selected suitably, the size of the positive shift amount of the electric potential at the first connection node, which is caused by the gate-drain current of the controlled FET $Q_1$, can be made approximately equal to the size of the negative shift amount of the electric potential at the first connection node caused by the drain-source current of the temperature compensation FET $Q_2$.

In this case, the surrounding temperature of the temperature compensation FET $Q_2$ also rises to a high level, causing a gate-drain current to flow through $Q_2$. Therefore, the electric potential at the first connection node is also shifted in the positive direction by this gate-drain current of the temperature compensation FET $Q_2$. However, the gate-drain current of the temperature compensation FET $Q_2$ also flows through the first resistor $R_1$. Hence, the electric potential at the first connection node is also shifted in the negative direction by the gate-drain current of the temperature compensation FET $Q_2$. In the case of the present embodiment (when the first resistor $R_1$, second resistor $R_2$, and third resistor $R_3$ have the same resistance), the size of the positive shift amount of the electric potential at the first connection node caused by the gate-drain current of the temperature compensation FET $Q_2$ is halved.

Thus, by appropriately selecting the gate width of the temperature compensation FET $Q_2$, the resistance value of each resistor, and the threshold voltage of the temperature compensation FET $Q_2$, a satisfactory degree of temperature compensation can be achieved.

Since the gate width of the temperature compensation FET $Q_2$ is determined by the magnitude of the drain-source current that flows through the temperature compensation FET $Q_2$, the saturated drain-source current suffices to be about 10 mA in the above-described embodiment. Hence, the gate width of the temperature compensation FET $Q_2$ suffices to be about 70 μm.

In addition, it is desirable that the controlled FET and the temperature compensation FET be of the same type. If the controlled FET and the temperature compensation FET are of the same type, both of the FETs can be manufactured in the same process. Moreover, the characteristics of both of the FETs, for example, the threshold voltages of both of the FETs change in the same manner in accordance with changes in temperature. As a result, the influence of the change in the surrounding temperature can be reduced to a virtually negligible level.

Second Embodiment

Next, with reference to FIG. 4, the second embodiment of the present invention will be explained. According to this embodiment, another FET gate bias voltage application circuit to which a temperature compensation FET is connected is provided, which is structured as follows. Four resistors are connected serially. The electric potential at the connection node of the second and third resistors is set to the gate bias voltage of the controlled FET. The drain of the temperature compensation FET is connected to the connection node of the first and second resistors. The source of the temperature compensation FET is grounded. The electric potential at the connection node of the third and fourth resistors is set to the gate bias voltage of the temperature compensation FET.

Figure 4:
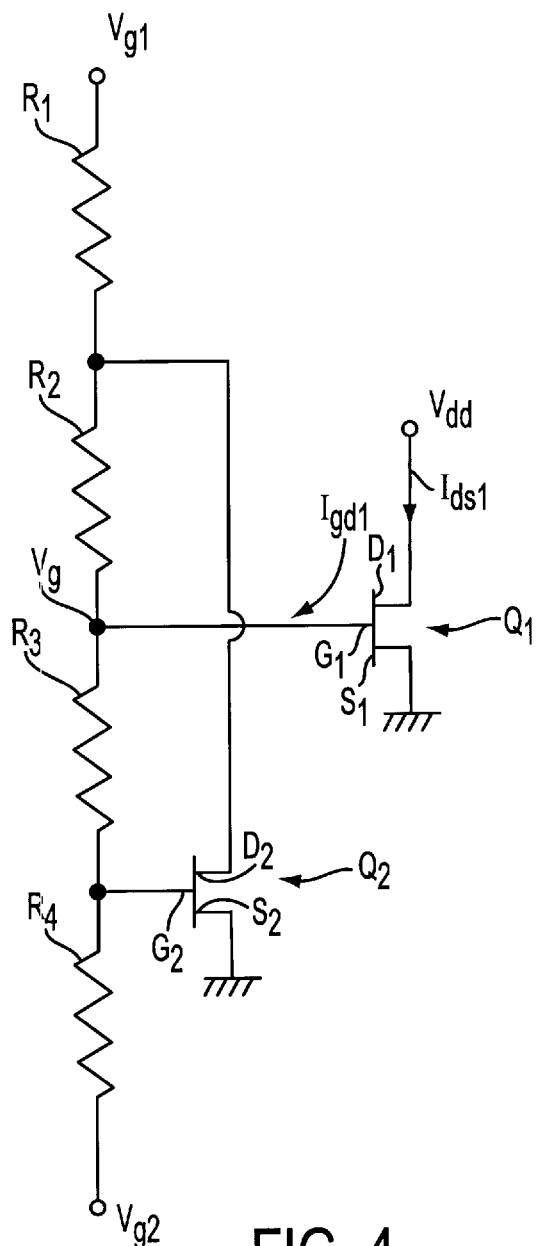
FIG. 4 is a connection diagram of a FET gate bias voltage application circuit according to the second embodiment of the present invention.

In FIG. 4, $Q_1$ is an n-channel depression type FET to be controlled. A voltage $V_{dd}$ (+3V) is applied to the drain $D_1$ of $Q_1$. The source $S_1$ of $Q_1$ is grounded. A gate bias voltage (−1V) to be described below is applied to the gate $G_1$ of $Q_1$. In this state, the controlled FET $Q_1$ is conductive, through which a drain-source current $I_{ds1}$ is flowing.

Four resistors $R_1$ (667Ω), $R_2$ (667Ω), $R_3$ (167Ω), and $R_4$ (500Ω) are connected serially in this order. A voltage $V_{g1}$ (+3V) is applied to the end of the first resistor $R_1$ not connected to the second resistor $R_2$. A voltage $V_{g2}$ (−3V) is applied to the end of the fourth resistor $R_4$ not connected to the third resistor $R_3$. The resistance values of the resistors $R_1$ (667Ω), $R_2$ (667Ω), $R_3$ (167Ω), and $R_4$ (500Ω) satisfy the relations $R_1=R_2=R_3+R_4$, and $R_3=R_4/3$. The electric potential at the connection node of the second resistor $R_2$ and the third resistor $R_3$ is −1V. This voltage is applied as a gate bias voltage $V_g$ to the gate $G_1$ of the controlled FET $Q_1$. As a result, the drain-source current $I_{ds1}$ flows through the controlled FET $Q_1$. A high frequency input signal is input superposed on this gate bias voltage $V_g$. The reference point of the high frequency drain source current of the controlled FET $Q_1$ becomes the above stated drain-source current $I_{ds1}$.

Since the aim of the controlled FET $Q_1$ is to amplify the high frequency input signal, the gate width of $Q_1$ is determined in accordance with the high frequency output of $Q_1$. If the high frequency output of $Q_1$ is 1 W (30 $dB_m$), for example, the saturated drain-source current becomes about 2 A, and the corresponding gate width becomes about 10 mm.

$Q_2$ is a temperature compensation FET according to the present invention. $Q_2$ is an n-channel depression type FET whose threshold voltage is −1.5V. The voltage (−1.5V) at the connection node of the third resistor $R_3$ and fourth resistor $R_4$ is applied to the gate $G_2$ of $Q_2$. $Q_2$ is non-conductive in this state. The voltage (+1V) at the connection node of the first resistor $R_1$ and second resistor $R_2$ is applied to the drain $D_2$ of $Q_2$. The source $S_2$ of $Q_2$ is grounded.

When the surrounding temperature is low, the temperature compensation FET $Q_2$ is non-conductive. The gate-drain current $I_{gd1}$ of the controlled FET $Q_1$ is zero when the surrounding temperature is low. However, when the surrounding temperature rises above 50° C., the maximum of the gate-drain current $I_{gd1}$ reaches about 1 mA. This current $I_{gd1}$ is superposed on the intended current (1.5 mA) determined by the resistance values of the first resistor $R_1$, second resistor $R_2$, third resistor $R_3$, and fourth resistor $R_4$, and by the direct current voltage ($V_{g1}-V_{g2}=3V-(-3V)=6V$) applied to the first resistor $R_1$, second resistor $R_2$, and third resistor $R_3$. The resultant current flows through the third resistor $R_3$ and fourth resistor $R_4$.

Therefore, without the temperature compensation FET $Q_2$, the electric potential at the first connection node is shifted in the positive direction by 0.667V, and the reference point of the drain-source current $I_{ds1}$ is displaced significantly.

However, according to the present embodiment, when the electric potential at the first connection node is shifted in the positive direction, the electric potential at the first connection node becomes higher than the threshold voltage (−1.5V) of the temperature compensation FET $Q_2$. As a result, the temperature compensation FET $Q_2$ becomes conductive, and a drain-source current $I_{ds2}$ flows through the temperature compensation FET $Q_2$. This drain-source current $I_{ds2}$ flows through the first resistor $R_1$. Therefore, the amount of voltage drop generated in the first resistor $R_1$ increases. As a result, the electric potential at the second connection node is shifted in the negative direction. In this case, the resistance of the temperature compensation FET $Q_2$ does not become zero. Hence, a current continues to flow through the second resistor $R_2$ and third resistor $R_3$, and fourth resistor $R_4$. Since the resistance value of the second resistor $R_2$ is equivalent to the sum of the resistance values of the third resistor $R_3$ and fourth resistor $R_4$, the electric potential at the first connection node is shifted in the negative direction by half the negative shift amount of the electric potential of the second connection node. In this case, if the current that flows through the temperature compensation FET $Q_2$ is selected suitably, the size of the positive shift amount of the electric potential at the first connection node, which is caused by the gate-drain current of the controlled FET $Q_1$, can be made approximately equal to the size of the negative shift amount of the electric potential at the first connection node caused by the drain-source current of the temperature compensation FET $Q_2$.

In this case, the surrounding temperature of the temperature compensation FET $Q_2$ also rises to a high level, causing a gate-drain current to flow through $Q_2$. Therefore, the electric potential at the third connection node is shifted in the positive direction by this gate-drain current of the temperature compensation FET $Q_2$. As a result, the electric potential at the first connection node is also shifted in the positive direction. However, the gate-drain current of the temperature compensation FET $Q_2$ flows through the first resistor $R_1$. Hence, the electric potentials at the first, second, and third connection nodes are also shifted in the negative direction and canceled by the gate-drain current of the temperature compensation FET $Q_2$. Therefore, the positive shift of the electric potential at the first connection node does not pose a significant problem in practice.

Thus, by appropriately selecting the gate width of the temperature compensation FET $Q_2$, the resistance value of each resistor, and the threshold voltage of the temperature compensation FET $Q_2$, a satisfactory degree of temperature compensation can be achieved.

Since the magnitude of the saturated drain-source current of the temperature compensation FET $Q_2$ is large, the gate width of the temperature compensation FET $Q_2$ is selected to be about 50 µm.

In addition, according to the present embodiment, the gate width and threshold voltage of the controlled FET $Q_1$ are approximately the same as those of the temperature compensation FET $Q_2$. Hence, both of these FETs can be manufactured simultaneously in the same process. Thus, both of these FETs can be easily made monolithic.

Moreover, when the present embodiment is implemented using discrete FETs, FETs having the same gate width, that is, FETs of the same type, can be used, which is advantageous in manufacturing.

In addition, it is desirable that the controlled FET and the temperature compensation FET be of the same type. If the controlled FET and the temperature compensation FET are of the same type, both FETs can be manufactured in the same process. Moreover, the characteristics of both FETs, for example, the threshold voltages of both FETs change in the same manner in accordance with changes in the surrounding temperature. As a result, the influence of the change in the surrounding temperature can be reduced to a virtually negligible level.

Third and Fourth Embodiments

Figure 5:
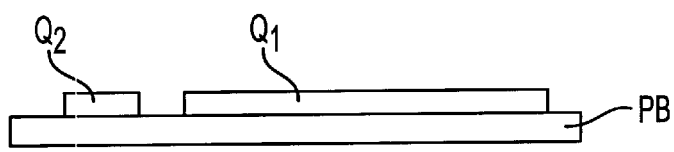
FIG. 5 is a side view of a semiconductor apparatus according to the third and fourth embodiments of the present invention.
Figure 6:
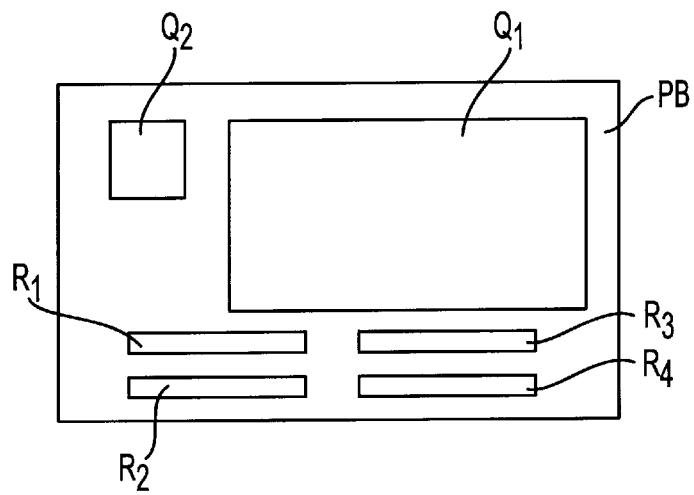
FIG. 6 is a top view of the semiconductor apparatus according to the third and fourth embodiments of the present invention.

With reference to FIGS. 5 and 6, the third and fourth embodiments of the present invention will be explained. According to the third embodiment, a semiconductor apparatus bonded onto a print substrate having a large heat conductivity on which the controlled FET and temperature compensation FET of the first embodiment and at least a portion of the resistance type potential dividing circuit of the first embodiment are installed or formed is provided. According to the fourth embodiment, a semiconductor apparatus bonded onto a print substrate having a large heat conductivity on which the controlled FET and temperature compensation FET of the second embodiment and at least a portion of the resistance type potential dividing circuit of the second embodiment are installed or formed is provided.

FIG. 5 is a side view of the semiconductor apparatus according to the third and fourth embodiments of the present invention. FIG. 6 is a top view of the semiconductor apparatus according to the third and fourth embodiments of the present invention.

$Q_1$ is a semiconductor chip (GAS chip) in which the above-described controlled FET is formed. $Q_2$ is a semiconductor chip (GaAS chip) in which the above-described temperature compensation FET is formed. PB is a print substrate having a large heat conductivity in which at least a portion of the resistance type potential dividing circuit of the above-described FET gate bias voltage application circuit is installed or formed. The controlled FET $Q_1$ and the temperature compensation FET $Q_2$ are bonded onto the print substrate PB, and are separated by a small distance. Metals such as Al and Cu, or ceramic materials such as $Al_2O_3$ and BN, or composite materials constructed by forming a metal film on a plate material made of metal such as Al and Cu, or composite materials constructed by forming a metal film on an insulating material can be used for the material of this print substrate PB.

In order to operate the FET gate bias voltage application circuits of the first and second embodiments, all the constitutive components are needed. Hence, the remaining components are externally attached.

Since the threshold voltage of a GaAs FET has a temperature coefficient of about $-1$ mV/° C., the threshold voltage of the GaAs FET is shifted in the negative direction by 0.11V in accordance with the maximum temperature change (110° C.) in the range of change in the surrounding temperature ($-30°$ C. to 80° C.) in which cellular phones or the like are used. Therefore, when the GaAs FET is an n-channel FET, the threshold voltage of the GaAs FET increases the level of its drain-source current.

On the other hand, as has been described above, the level of the gate-drain current increases at a high temperature. Hence, these two effects are added up.

If the high frequency output of the controlled FET $Q_1$ is 1 W and the power efficiency of the controlled FET $Q_1$ is 70%, the controlled FET $Q_1$ loses a power amount of 0.43 W internally in the form of heat. Therefore, the temperature of the controlled FET $Q_1$ increases by the value obtained by dividing this amount 0.43 W of the internally generated heat by the heat resistance between a geometric position not influenced by this heat generated inside the controlled FET $Q_1$ and the heat generating region of the controlled FET $Q_1$.

In the present embodiment, both the controlled FET $Q_1$ and the temperature compensation FET $Q_2$ are GaAs FETs installed nearby each other. Hence, these two FETs are held at about the same temperature. As a result, the gate bias voltage of the controlled FET $Q_1$ is shifted in the positive direction as the gate-drain current of the controlled FET $Q_1$ increases. At the same time, the gate bias voltage of the temperature compensation FET $Q_2$ is shifted in the negative direction as the gate-drain current of the temperature compensation FET $Q_2$ increases. Therefore, by installing the controlled FET $Q_1$ and the temperature compensation FET $Q_2$ nearby each other on a print substrate having a large heat conductivity, the temperature compensation effect, which is the object of the present invention, is enhanced.

Figure 3:
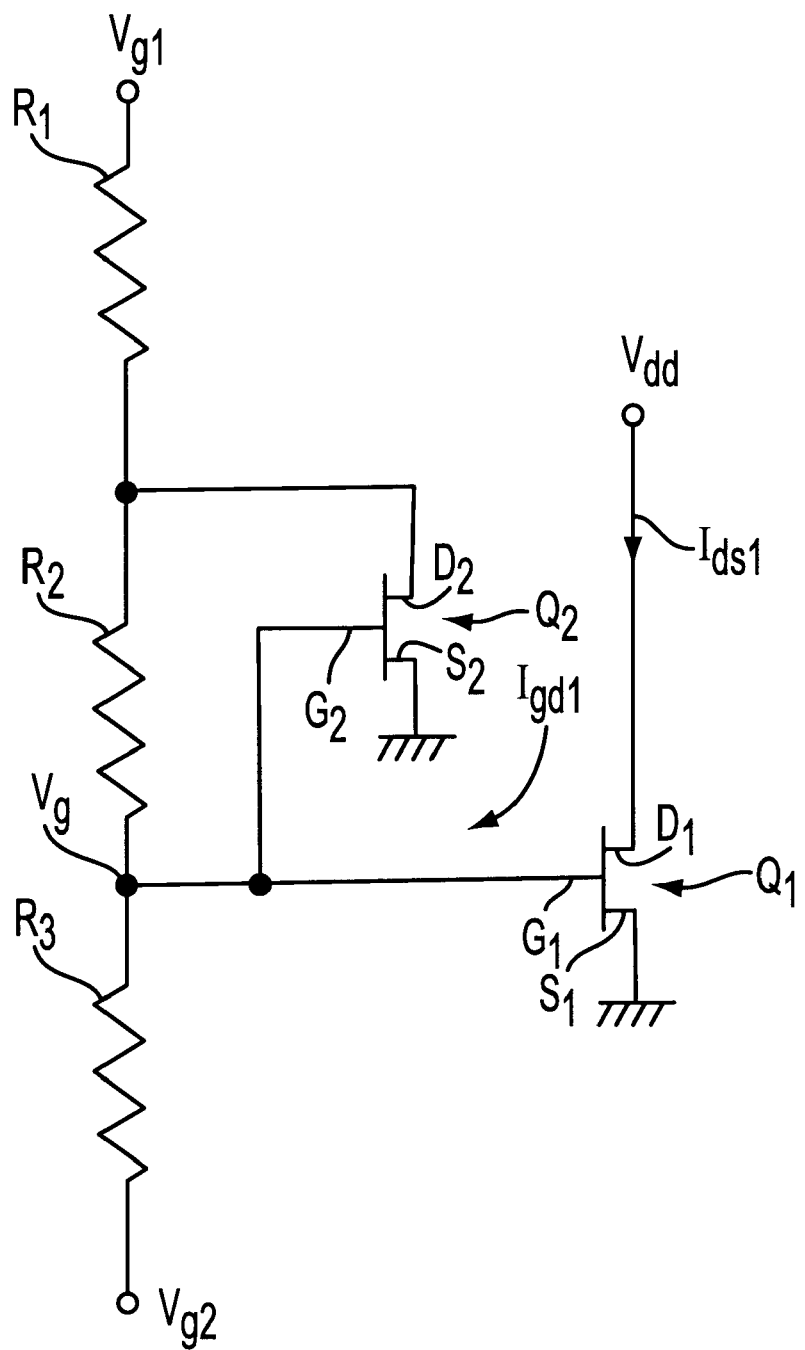
FIG. 3 is a connection diagram of a FET gate bias voltage application circuit according to the first embodiment of the present invention.

The gate bias voltage $V_g$ of the FET gate bias voltage application circuit of the first embodiment shown in FIG. 3 is $-1$V at a room temperature of 20° C. When the surrounding temperature rises to 80° C., the gate bias voltage $V_g$ of the FET gate bias voltage application circuit is shifted only slightly in the negative direction to $-1.06$V. Thus, a satisfactory level of temperature compensation is achieved by this operation.

By a similar operation, in the FET gate bias voltage application circuit of the second embodiment shown in FIG. 4, the gate bias voltage $V_g$ of the controlled FET $Q_1$ and the gate bias voltage $V_2$ of temperature compensation FET $Q_2$ are $-1$V and $-1.5$V, respectively, at a room temperature of 20° C. When the surrounding temperature rises to 80° C., in accordance with the equation $$V_g = (V_{g1} - V_{g2})R_3/(R_1 + R_2 + R_3) + V_2,$$

the gate bias voltage $V_g$ of the FET gate bias voltage application circuit is shifted slightly in the negative direction to 1.05V. Thus, a satisfactory level of temperature compensation is achieved.

The amount of change in the gate bias voltage $V_g$ of the FET gate bias voltage application circuit is reduced to $(R+R_2)/(R_1+R_2+R_3)$ times the amount of change in the threshold voltage of the controlled FET $Q_1$. In the FET gate bias voltage application circuit of the second embodiment shown in FIG. 4, the amount of change in the gate bias voltage $V_g$ of the FET gate bias voltage application circuit is reduced to 89% of the amount of change in the threshold voltage of the controlled FET $Q_1$, which is close to 100%.

Fifth and Sixth Embodiments

With reference to FIGS. 5 and 6, the fifth and sixth embodiments of the present invention will be explained. According to the fifth embodiment, a semiconductor apparatus bonded onto a print substrate having a large heat conductivity on which the controlled FET of the first embodiment and at least a portion of the resistance type potential dividing circuit of the first embodiment are installed or formed is provided. According to the sixth embodiment, a semiconductor apparatus bonded onto a print substrate having a large heat conductivity on which the controlled FET of the second embodiment and at least a portion of the resistance type potential dividing circuit of the second embodiment are installed or formed is provided.

Figure 7:
FIG. 7 is a side view of a semiconductor apparatus according to the fifth and sixth embodiments of the present invention.
Figure 8:
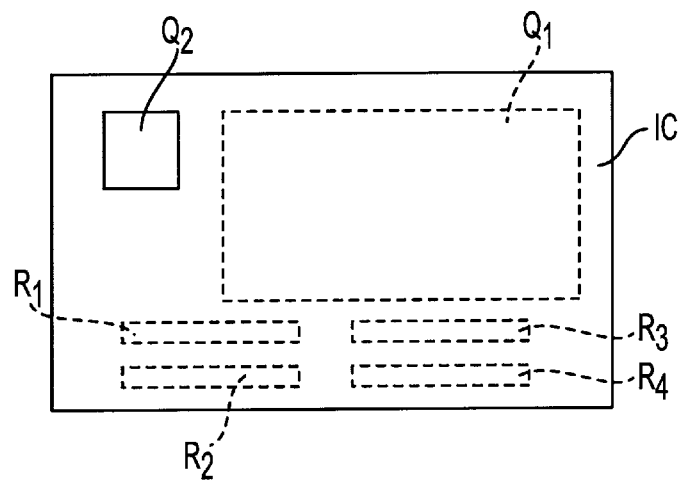
FIG. 8 is a top view of the semiconductor apparatus according to the fifth and sixth embodiments of the present invention.

FIG. 7 is a side view of the semiconductor apparatus according to the fifth and sixth embodiments of the present invention. FIG. 8 is a top view of the semiconductor apparatus according to the fifth and sixth embodiments of the present invention.

IC is a circuit in which at least a portion of the resistance type potential dividing circuit of the above-described FET gate bias voltage application circuit is installed or formed. The remaining components of the FET gate bias voltage application circuits of the first and second embodiments are externally attached.

In the fifth and sixth embodiments of the present invention also, the surrounding temperature of the controlled FET $Q_1$ and that of the temperature compensation FET $Q_2$ change approximately in the same manner. Therefore, the benefits achieved in the third and fourth embodiments of the present invention can also be achieved in the fifth and sixth embodiments of the present invention.

According to the fifth and sixth embodiments, the controlled FET $Q_1$ can be manufactured independently. Therefore, the manufacturing cost of the FET gate bias voltage application circuit can be reduced, which is an advantage.

Seventh And Eighth Embodiments

Figure 9:
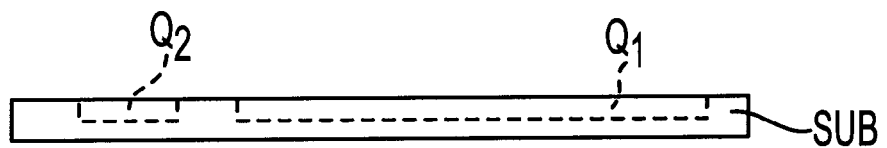
FIG. 9 is a side view of a semiconductor apparatus according to the seventh and eighth embodiments of the present invention.
Figure 10:
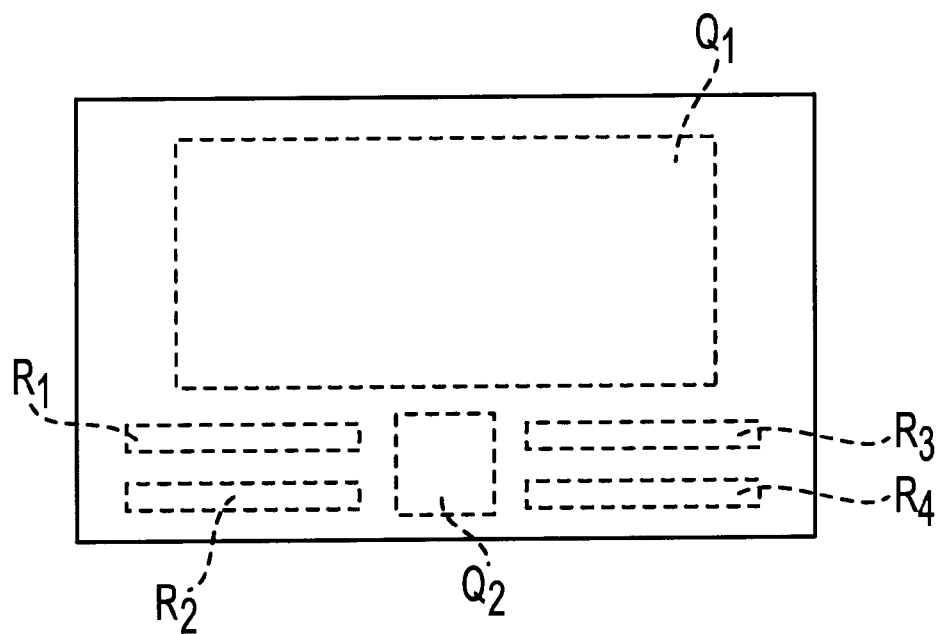
FIG. 10 is a top view of the semiconductor apparatus according to the seventh and eighth embodiments of the present invention.

With reference to FIGS. 9 and 10, the seventh and eighth embodiments of the present invention will be explained. According to the seventh embodiment, a semiconductor apparatus in which the controlled FET and temperature compensation FET and at least a portion of the resistance type potential dividing circuit of the FET gate bias voltage application circuit of the first embodiment are formed monolithically on a single semiconductor chip is provided. According to the eighth embodiment, a semiconductor apparatus in which the controlled FET and temperature compensation FET and at least a portion of the resistance type potential dividing circuit of the resistance type potential dividing circuit of the FET gate bias voltage application circuit of the second embodiment are formed monolithically on a single semiconductor chip is provided.

The remaining components of the FET gate bias voltage application circuits of the first and second embodiments not shown in the drawings are externally attached.

Ninth And Tenth Embodiments

With reference to FIGS. 9 and 10, the ninth and tenth embodiments of the present invention will be explained. According to the ninth embodiment, a semiconductor apparatus in which the FET gate bias voltage application circuit of the first embodiment is formed monolithically on a single semiconductor chip is provided. According to the tenth embodiment, a semiconductor apparatus in which the FET gate bias voltage application circuit of the second embodiment is formed monolithically on a single semiconductor chip is provided.

FIG. 9 is a side view of the semiconductor apparatus according to the ninth and tenth embodiments of the present invention. FIG. 10 is a top view of the semiconductor apparatus according to the ninth and tenth embodiments of the present invention.

SUB is a semiconductor substrate (GaAs substrate) on the surface layer of which the circuit elements ($Q_1$, $Q_2$, $R_1$, $R_2$, $R_3$, $R_4$, and wires connected to these circuit elements) of the first or second embodiment are formed monolithically.

When the circuit of the first embodiment is used, the controlled FET $Q_1$ and temperature compensation FET $Q_2$ can be formed simultaneously in the same process, which is an advantage.

The ninth and tenth embodiments also provide the same benefits as the third and fourth embodiments.

As alterations and modifications of the fifth through eighth embodiments, the following semiconductor apparatuses are considered.

1. A semiconductor apparatus constructed by bonding a semiconductor substrate, on which the controlled FET is formed, with a semiconductor substrate in which the temperature compensation FET and at least a portion or all of the other circuit (resistance type potential dividing circuit) according to the first embodiment are formed.

2. A semiconductor apparatus constructed by bonding a semiconductor substrate, on which the controlled FET is formed, with a semiconductor substrate in which the temperature compensation FET and at least a portion or all of the other circuit (resistance type potential dividing circuit) according to the second embodiment are formed.

3. A semiconductor apparatus constructed by bonding a semiconductor substrate in which the controlled FET and at least a portion or all of the other circuit (resistance type potential dividing circuit) are formed (they may be formed as a package) onto a print substrate.

4. A semiconductor apparatus constructed by bonding a semiconductor substrate on which the temperature compensation FET and at least a portion or all of the other circuit (resistance type potential dividing circuit) are formed (they may be formed as a package) onto a semiconductor substrate in which the controlled FET is formed (the controlled FET may be formed as a package).

5. A semiconductor apparatus constructed by bonding a semiconductor substrate in which the temperature compensation FET is formed (the temperature compensation FET may be formed as a package), a semiconductor substrate in which at least a portion or all of the other circuit (resistance type potential dividing circuit) is formed (the portion of the resistance type potential dividing circuit may be formed as a package), and a semiconductor substrate in which the controlled FET is formed (the controlled FET may be formed as a package) onto a print substrate.

Since the main idea of the present invention is to install a temperature compensation FET, the configurations of the transistors and resistors can be modified or altered in any conceivable manner.

Thus, the FET gate bias voltage application circuit according to the present invention is non-conductive when the surrounding temperature is low. However, a temperature compensation FET is installed in the FET gate bias voltage application circuit. When the surrounding temperature rises to a high level, the level of the gate-drain current of the controlled FET increases, which causes the temperature compensation FET to become conductive. The amount of shift of the gate-bias voltage caused by the increased gate-drain current of the controlled FET is canceled by the amount of shift of the gate-bias voltage generated when the temperature compensation FET becomes conductive. As a result, the gate-drain current of the controlled FET is held constant regardless of the change in the surrounding temperature.

Moreover, since the semiconductor apparatuses according to the present invention contain the FET gate-bias voltage application circuit according to the present invention, the gate-drain current of the controlled FET installed in each of these semiconductor apparatuses is held constant.

What is claimed is:

1. A field effect transistor gate bias voltage application circuit in which a divided voltage is applied to a gate of a controlled field effect transistor from a first intermediate point of a resistance type potential dividing circuit to which a direct current voltage is applied, comprising, a temperature compensation field effect transistor, which becomes conductive at a gate voltage higher than a gate voltage of said controlled field effect transistor, having a gate to which a voltage divided at said first intermediate point is applied, a drain connected to a second intermediate point at which an electric potential is higher than an electric potential at said first intermediate point, and a source that is grounded, wherein said temperature compensation field effect transistor remains non-conductive when a gate-drain current of said controlled field effect transistor is at a low level but becomes conductive when said gate-drain current of said controlled field effect transistor increases to a high level to cause a drain-source current to flow and to increase an amount of voltage drop at a region having an electric potential higher than an electric potential at said second intermediate point of said resistance type potential dividing circuit causing said electric potentials at said first and second intermediate points to be shifted in a negative direction, respectively, such that said shift in said negative direction of said electric potential at said first intermediate point generated by said drain-source current of said temperature compensation field effect transistor compensates for a shift in a positive direction of said electric potential at said first intermediate point generated by said increase in said gate-drain current of said controlled field effect transistor.

2. A semiconductor apparatus comprising:

a print substrate having a large heat conductivity in which at least a portion of a resistance type potential dividing circuit as claimed in claim 1 is installed or formed;

a controlled field effect transistor as claimed in claim 1 bonded onto said print substrate; and a temperature compensation field effect transistor as claimed in claim 1 bonded onto said print substrate.

3. A semiconductor apparatus comprising:

a print substrate having a large heat conductivity in which a controlled field effect transistor as claimed in claim 1 and at least a portion of a resistance type potential dividing circuit as claimed in claim 1 are installed or formed; and a temperature compensation field effect transistor as claimed in claim 1 bonded onto said print substrate.

4. A semiconductor apparatus comprising a single semiconductor chip having:

a controlled field effect transistor as claimed in claim 1;

a temperature compensation field effect transistor as claimed in claim 1; and at least a portion of a resistance type potential dividing circuit as claimed in claim 1.

5. A semiconductor apparatus comprising a single semiconductor chip having a field effect transistor gate bias voltage application circuit as claimed in claim 1.

6. A field effect transistor gate bias voltage application circuit as claimed in claim 1 wherein said controlled field effect transistor and said temperature compensation field effect transistor are of an identical type.

* * * * *